United States Patent
Arutinov et al.

(10) Patent No.: US 9,918,392 B2
(45) Date of Patent: Mar. 13, 2018

(54) METHOD AND APPARATUS FOR ASSEMBLING A COMPONENT WITH A FLEXIBLE FOIL, AS WELL AS THE ASSEMBLED PRODUCT

(71) Applicant: Nederlandse Organisatie voor toegepast-natuurwetenschappelijk onderzoek TNO, The Hague (NL)

(72) Inventors: Gari Arutinov, The Hague (NL); Gerardus Titus Van Heck, The Hague (NL); Edsger Constant Pieter Smits, The Hague (NL)

(73) Assignee: Nederlandse Organisatie voor toegepast-natuurwetenschappelijk onderzoek TNO, 's-Gravenhage (NL)

( * ) Notice: Subject to any disclaimer, the term of this patent is extended or adjusted under 35 U.S.C. 154(b) by 87 days.

(21) Appl. No.: 15/101,482

(22) PCT Filed: Nov. 28, 2014

(86) PCT No.: PCT/NL2014/050815
§ 371 (c)(1),
(2) Date: Jun. 3, 2016

(87) PCT Pub. No.: WO2015/084164
PCT Pub. Date: Jun. 11, 2015

(65) Prior Publication Data
US 2016/0374211 A1    Dec. 22, 2016

(30) Foreign Application Priority Data

Dec. 6, 2013   (EP) ..................................... 13196117

(51) Int. Cl.
*H01L 23/00* (2006.01)
*H05K 3/30* (2006.01)
(Continued)

(52) U.S. Cl.
CPC ............. *H05K 3/305* (2013.01); *H01L 24/75* (2013.01); *H01L 24/83* (2013.01); *H01L 24/97* (2013.01);
(Continued)

(58) Field of Classification Search
CPC ......... H01L 24/97; H01L 24/83; H01L 24/75; H01L 2924/12042; H01L 2224/83855;
(Continued)

(56) References Cited

U.S. PATENT DOCUMENTS 5,468,681 A * 11/1995 Pasch ................... G03F 7/70433
                                                       156/329
5,679,194 A * 10/1997 Fjelstad .............. H01L 23/4985
                                                       156/150
(Continued)

FOREIGN PATENT DOCUMENTS

DE    19581457 C1    4/1999
JP    S61226419 A    10/1986
(Continued)

OTHER PUBLICATIONS

Apr. 21, 2015—International Search Report and Written Opinion for PCT/NL2014/050815.
(Continued)

*Primary Examiner* — Xanthia C Cunningham
(74) *Attorney, Agent, or Firm* — Banner & Witcoff, Ltd.

(57) ABSTRACT

Method and apparatus for assembling a component with a flexible foil, as well as assembled product A method is provided for assembling a component (20) with a flexible foil (10). The method comprising the steps of —providing (SI) a flexible foil (10) having a first side (11) with at least one liquid confinement zone (12) and at least one liquid confinement subzone (13) enclosed by the liquid confine-
(Continued)

ment zone, —depositing (S2) an alignment liquid (30) in the at least one liquid confinement subzone (13), —moving (S3) the component (20) towards the liquid confinement zone, and bringing (S4) a surface (21) of the component facing the flexible foil into contact with the alignment liquid in the at least one liquid confinement subzone and releasing (S5) the component (20). The step of moving (S3) the component (20) towards the flexible foil, and the step of bringing (S4) a surface (21) of the component facing the flexible foil into contact with the alignment liquid, is realized with a gripping tool (130) that includes one or more capillary tubes (131) ending in a downward facing opening (132). At least a portion of the capillary tubes that ends in the downward facing opening (132) is filled with a carrier liquid (135). A first, adhesive force (Fa1) exerted by the carrier liquid on the component is larger than a second force (Fg), that is exerted by gravity on the component and wherein said first adhesive force (Fa1) is smaller than the sum (Fg+Fa2) of said second force (Fg) and a third, adhesive force (Fa2) exerted by the alignment liquid on the component when the component comes into contact with the alignment liquid. The alignment liquid (30) in contact with the component (20) exerts adhesive forces on the component that align the released component with the flexible foil.

14 Claims, 14 Drawing Sheets

(51) Int. Cl.
*H05K 1/16* (2006.01)
*H05K 1/18* (2006.01)
*H05K 13/00* (2006.01)
*H05K 13/04* (2006.01)

(52) U.S. Cl.
CPC ............... *H05K 1/16* (2013.01); *H05K 1/189* (2013.01); *H05K 13/0015* (2013.01); *H05K 13/0469* (2013.01); *H01L 24/27* (2013.01); *H01L 24/29* (2013.01); *H01L 24/32* (2013.01); *H01L 2224/27013* (2013.01); *H01L 2224/2732* (2013.01); *H01L 2224/2929* (2013.01); *H01L 2224/29339* (2013.01); *H01L 2224/32225* (2013.01); *H01L 2224/32245* (2013.01); *H01L 2224/743* (2013.01); *H01L 2224/757* (2013.01); *H01L 2224/7598* (2013.01); *H01L 2224/75701* (2013.01); *H01L 2224/83002* (2013.01); *H01L 2224/83143* (2013.01); *H01L 2224/83192* (2013.01); *H01L 2224/83855* (2013.01); *H01L 2224/95102* (2013.01); *H01L 2224/95115* (2013.01); *H01L 2224/95146* (2013.01); *H01L 2924/12042* (2013.01); *H05K 2203/166* (2013.01)

(58) Field of Classification Search
CPC ............... H01L 24/32; H01L 24/27; H01L 2224/83002; H01L 2224/27013; H01L 2224/75701; H01L 2224/7598; H01L 2224/95146; H01L 2224/95115; H01L 2224/95102; H01L 24/29; H01L 2224/83192; H01L 2224/83143; H01L 2224/757; H01L 2224/743; H01L 2224/32245; H01L 2224/32225
See application file for complete search history.

(56) References Cited

U.S. PATENT DOCUMENTS

| | | | | |
|---|---|---|---|---|
| 6,121,988 | A * | 9/2000 | Uchiyama | G02F 1/13452 174/260 |
| 6,208,521 | B1 * | 3/2001 | Nakatsuka | H01L 23/5387 174/254 |
| 7,880,277 | B2 * | 2/2011 | Seah | H01L 23/49572 257/668 |
| 2005/0085008 | A1 * | 4/2005 | Derderian | H01L 21/6835 438/106 |
| 2005/0287702 | A1 | 12/2005 | Victor Tan et al. | |
| 2008/0016682 | A1 | 1/2008 | Chou et al. | |
| 2011/0291302 | A1 * | 12/2011 | Mueller | H01L 24/29 257/783 |

FOREIGN PATENT DOCUMENTS

| | | |
|---|---|---|
| JP | H06339878 A | 12/1994 |
| JP | 2005235834 A | 9/2005 |
| JP | 2009049261 A | 3/2009 |
| WO | 2010/066366 A1 | 6/2010 |

OTHER PUBLICATIONS

Yasuhiro Kato et al: "Experimental Study on Microassembly by Using Liquid Surface Tension", Jan. 1, 2008, Jan. 1, 2008 (Jan. 1, 2008), pp. 1-4, XP007922567.

* cited by examiner

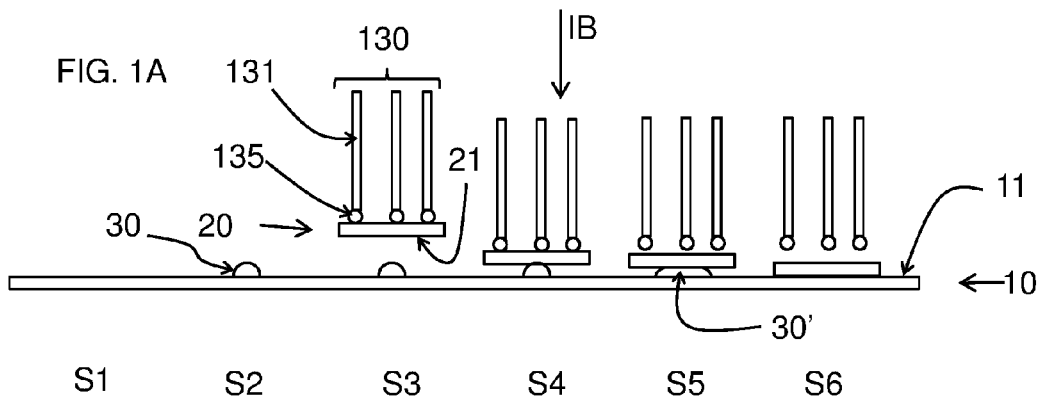
FIG. 1A
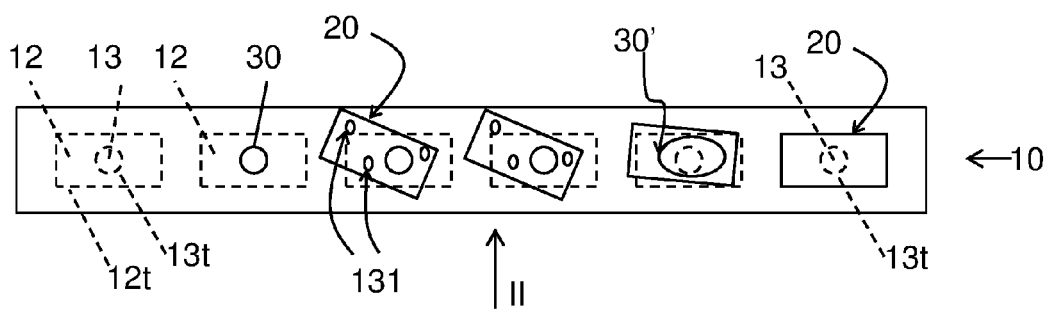
FIG. 1B
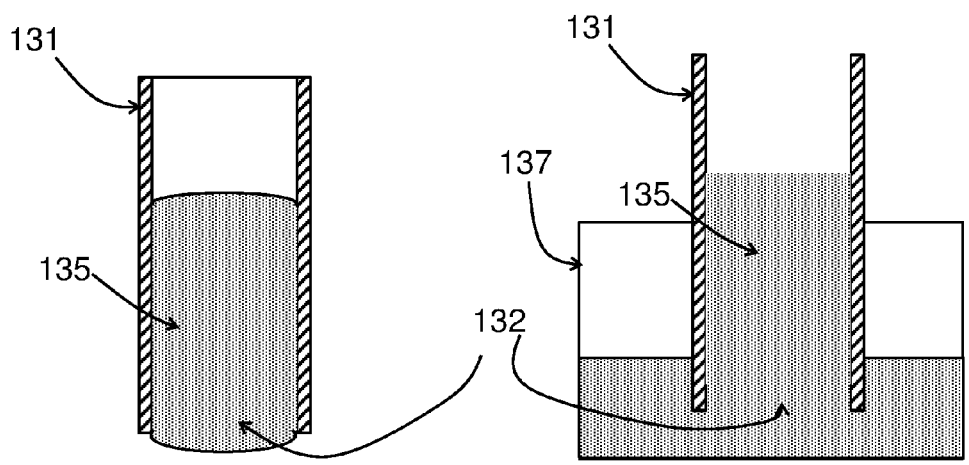
FIG. 2A
FIG. 2

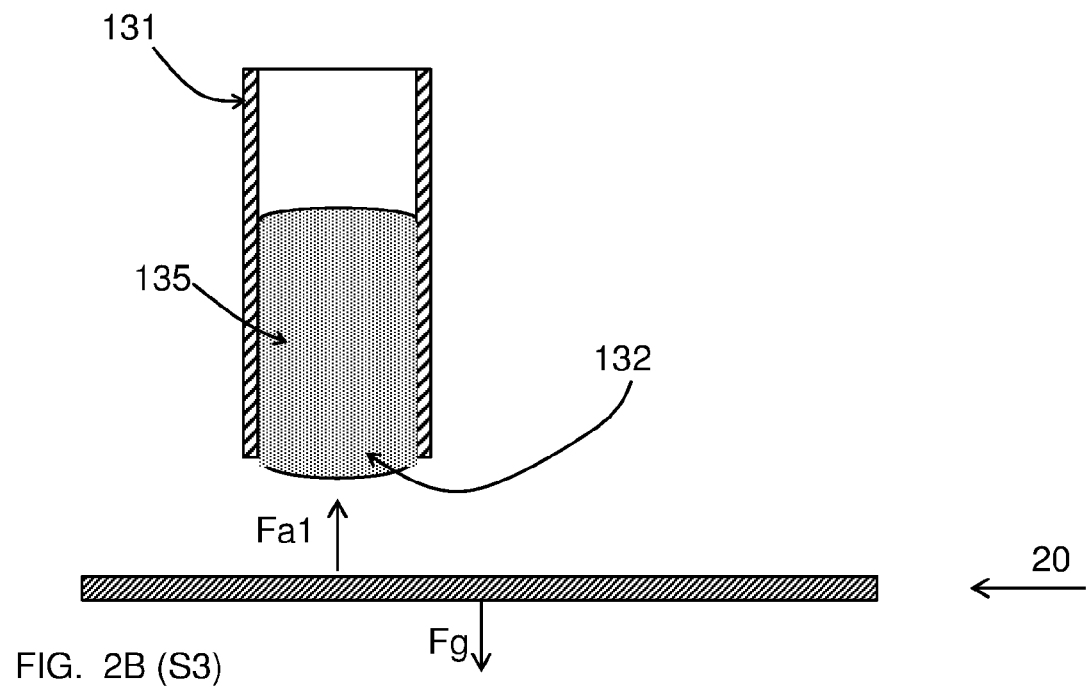
FIG. 2B (S3)
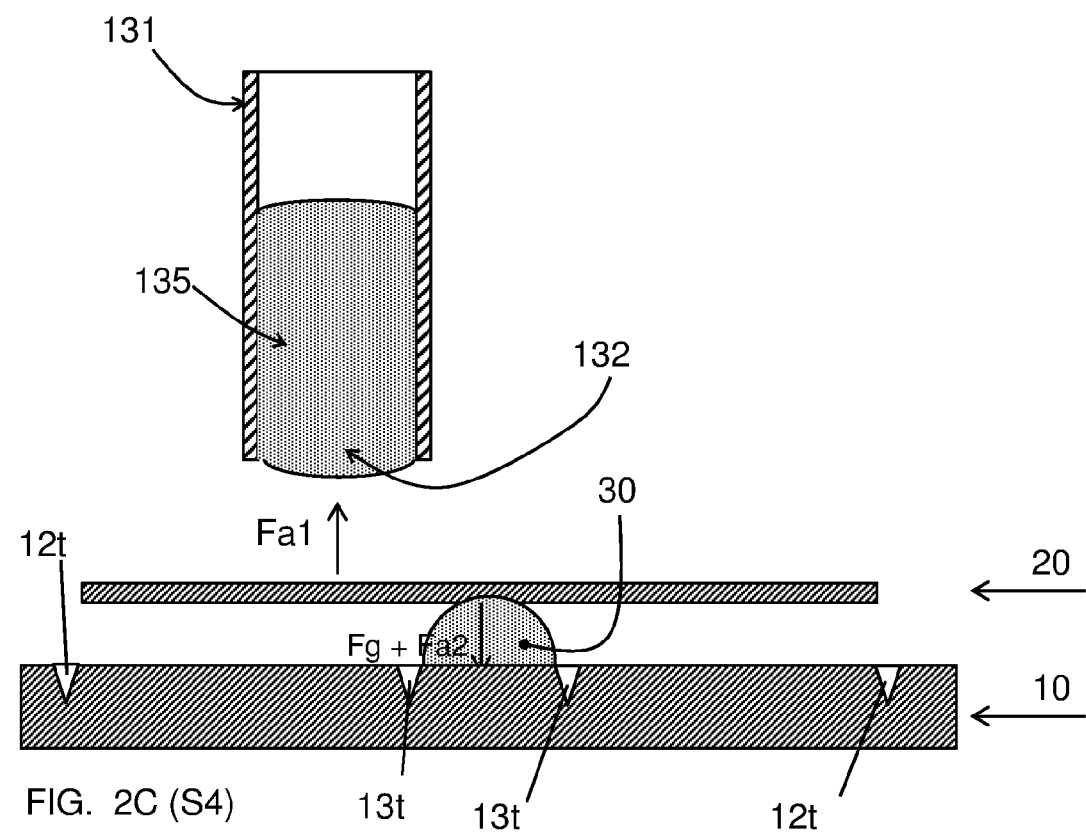
FIG. 2C (S4)

Case 2.

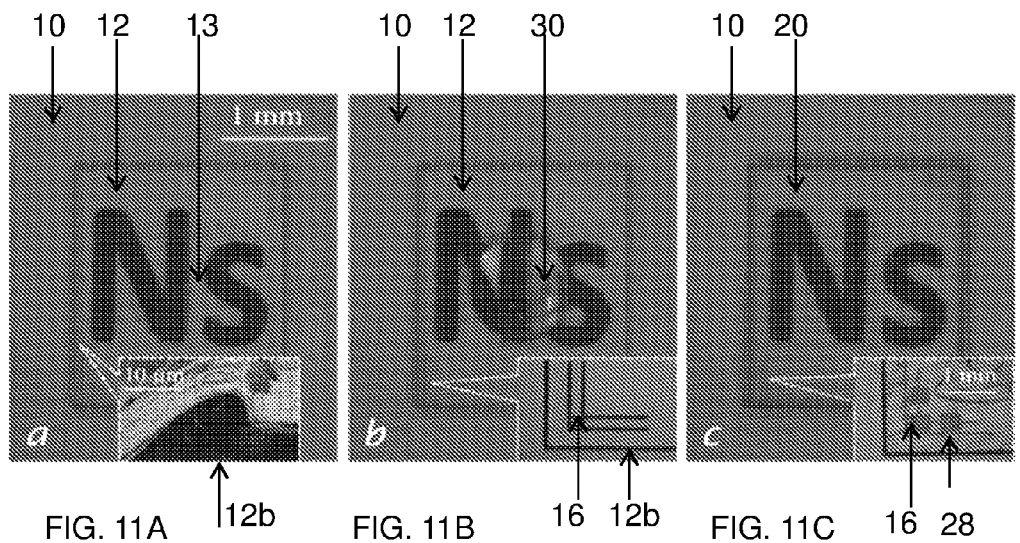
FIG. 11A  FIG. 11B  FIG. 11C
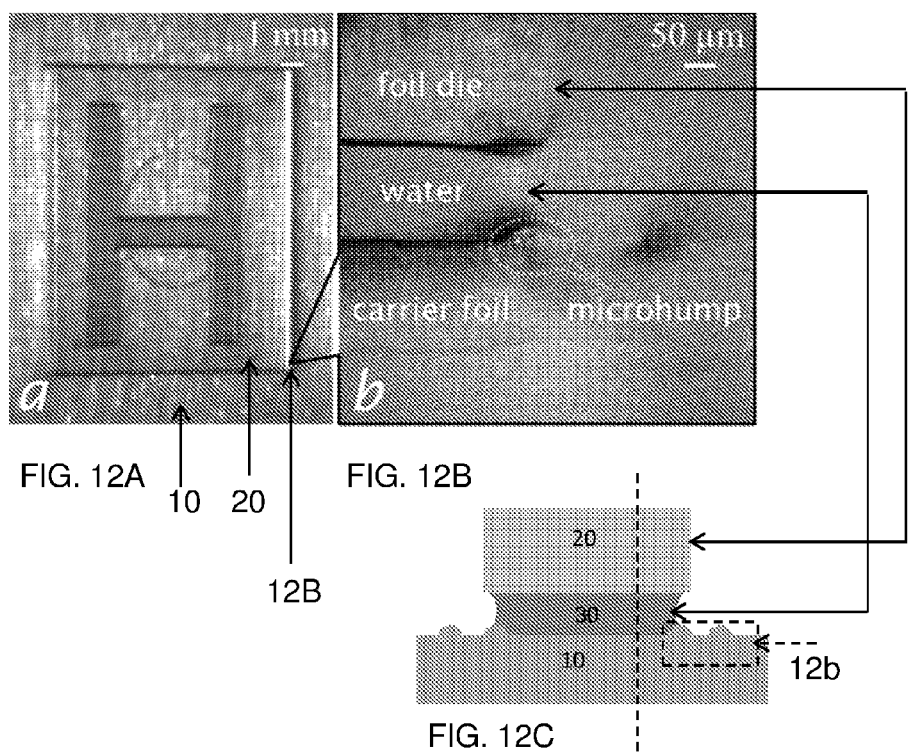
FIG. 12A  FIG. 12B
FIG. 12C

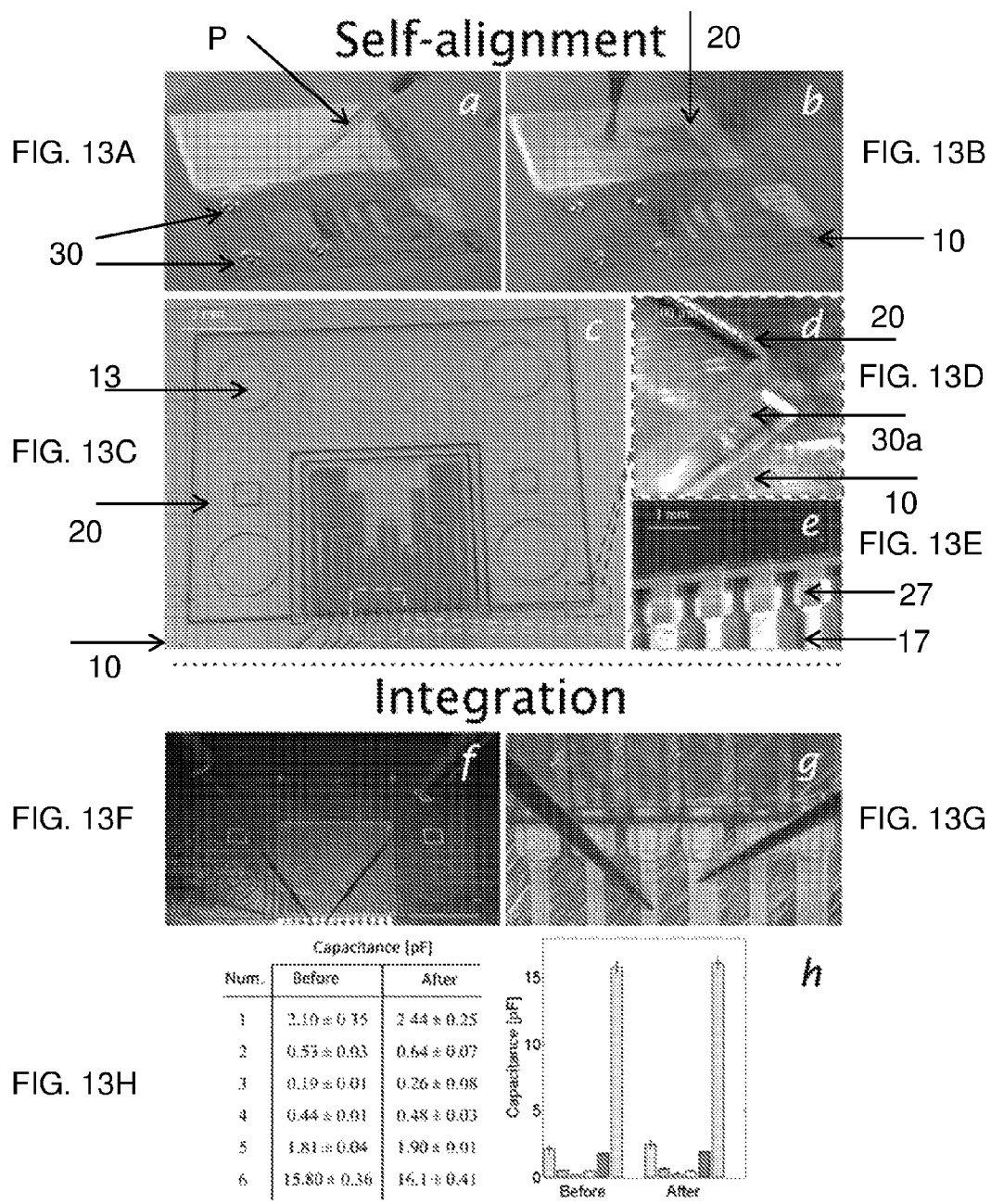

METHOD AND APPARATUS FOR ASSEMBLING A COMPONENT WITH A FLEXIBLE FOIL, AS WELL AS THE ASSEMBLED PRODUCT

CROSS-REFERENCE TO RELATED APPLICATIONS

This application is a U.S. National Stage application under 35 U.S.C. § 371 of International Application PCT/NL2014/050815 (published as WO 2015/084164 A1), filed Nov. 28, 2014, which claims priority to Application EP 13196117.9, filed Dec. 6, 2013. Benefit of the filing date of each of these prior applications is hereby claimed. Each of these prior applications is hereby incorporated by reference in its entirety.

BACKGROUND OF THE INVENTION

Field of the Invention

The present invention relates to a method for assembling a component with a web.

The present invention further relates to an apparatus for assembling a component with a web.

The present invention still further relates to an assembled product.

Related Art

Many manufacturing processes involve assembling of components of a mutually different nature on. More and more such manufacturing processes use a polymer or another flexible foil, e.g. from aluminum as a carrier on which the components are mounted. Use of a flexible foil allows for roll to roll assembly where the foil, serving as a web can be transported along various manufacturing stages.

Pick-and-place techniques are most common and effective for assembly purposes, i.e. to enable distributing components to the required target positions onto the carrier substrate (or web in case of R2R assembly). The major drawbacks and challenges of this approach are:

a) The throughput and costs. The process can't be run in the parallel to increase the throughput of the process, and in addition requires sophisticated, expensive and component size-sensitive tools for performing the assembly.

b) Known methods do not allow for a continuous nonstop assembly. Instead for precise assembly of the components a stop-and-go mechanism is used, wherein the web stops each time for the component to be placed to the predefined position on the web.

US20080016682 discloses a method for microstructure assembly, which comprises steps of: providing a carrier having a plurality of joints formed thereon; forming a pedestal on each joint; forming a droplet on each pedestal; placing a microstructure on each droplet; removing each droplet for enabling the corresponding microstructure to couple with the joint corresponding thereto. In the aforesaid method, the use of the plural droplets is to align the plural microstructures in an automatic manner so as to enable each microstructure to couple with its corresponding joint smoothly.

It is further noted that DE 19581457 discloses a gripper unit for handling micro sized components using an adhesive force between a fluid and the component to hold the component. The fluid is introduced through capillaries in a main block. Once the component is initially adhered to the surface it may be moved laterally to the correct position and suction applied. The component is then moved on the gripper to the mounting location over the carrier and is deposited by being mechanically displaced or by the application of air pressure.

SUMMARY OF THE INVENTION

It is an object of the present invention to provide method and apparatus that allow assembling a component with a flexible foil in a continuous roll to roll process, as well as to provide an assembled product that can be manufactured with such a method or apparatus.

According to a first aspect of the invention a method is provided for assembling a component with a web. Therein a web is provided having a first side with at least one liquid confinement zone.

Subsequently, an alignment liquid is deposited in the at least one liquid confinement zone.

Subsequently, the component is moved towards the liquid confinement zone. Therewith a surface of the component facing the web is brought into contact with the alignment liquid in the at least one liquid confinement zone and the component is released. The alignment liquid in the liquid confinement zone that is in contact with the component exerts adhesive forces on the component that align the released component with the web.

The step of moving the component towards the web, and the step of bringing a surface of the component facing the web into contact with the alignment liquid, is realized with a gripping tool that includes one or more capillary tubes ending in a downward facing opening. At least an end portion of the capillary tubes at the side of the downward facing opening is filled with a carrier liquid. Typically the tubes are open at both their ends. In this way the capillary tubes can be easily filled by immersing their downward facing opening in a bath with the carrier liquid. Already a small depth of immersion suffices to result in a filling of the tubes. A first, adhesive force exerted by the carrier liquid on the component is larger than a second force that is exerted by gravity on the component. The first adhesive force is smaller than the sum of said second force and a third, adhesive force exerted by the alignment liquid on the component when the component comes into contact with the alignment liquid.

According to a second aspect of the invention an apparatus is provided for assembling a component with a web. The inventive apparatus comprises a web-delivery unit to provide a web having a first side with at least one liquid confinement zone. The web-delivery unit may locally prepare the web having the specified zones from a standard web, e.g. obtained from a supply roll or other source. Alternatively, the web-delivery unit may deliver the web having the specified zones as a pre-processed product from a supply roll or other source.

The inventive apparatus further comprises a deposition unit to deposit an alignment liquid in the liquid confinement zone.

The inventive apparatus further comprises a component handling unit. In an operational state the component handling unit moves the component towards the desired position on the web and releases the component when it is sufficiently close to the desired position. The component handling unit comprises a gripping tool that includes one or more capillary tubes ending in a downward facing opening. In an operation state of the apparatus at least a portion of the capillary tubes that ends in the downward facing opening is filled with a carrier liquid, wherein a first, adhesive force exerted by the carrier liquid on the component is larger than a second force, that is exerted by gravity on the component and wherein said first adhesive force is smaller than the sum of said second force and a third, adhesive force exerted by the alignment liquid on the component when the component comes into contact with the alignment liquid.

The method according to the first aspect of the invention and the apparatus according to the second aspect of the invention obviate the need of a control mechanism for holding and releasing the component. The gripper automatically holds the component when the carrier liquid at the openings of the one or more capillary tubes contacts the component and automatically releases the component, when said surface of the component contacts the alignment liquid. It is noted that the adhesive force Fa1 exerted by the carrier liquid is the joint force exerted by the carrier liquid contacting the component at the opening of each of the one or more capillary tubes. Similarly, third adhesive force Fa2 is the joint force exerted by the alignment liquid in the at least one liquid confinement zone. Accordingly the relation Fg<Fa1<Fg+Fa2 can be easily satisfied by selection of the number of capillary tubes and a surface area of the liquid confinement zone provided with alignment liquid. Also the force Fa1 exerted by the carrier liquid can be tuned by the diameter of the capillary tubes. Also the adhesive forces can be controlled by selecting the alignment liquid, the carrier liquid and the surface energy of the component.

Even more important, the method according to the first aspect of the invention and the apparatus according to the second aspect of the invention strongly facilitate placement of components in a continuous roll to roll mechanism as the interaction between the carrier liquid and the component on the one hand and the interaction between the align liquid and the component on the one hand allows for a smooth transition from the gripper to the surface of the web. Even though the component may have an initial misalignment when it is released on the web, the component will be aligned after its release due to the forces exerted thereon by the alignment liquid.

Various liquids are suitable as the carrier liquid and as the alignment liquid. The alignment liquid and the carrier liquid preferably have a moderate viscosity (e.g. 1 to 50 times the viscosity of water) and a moderate surface tension (e.g. 0.1-1.0 of the surface tension of water). Suitable liquids are for example water, alcohol or oil. It is not necessary that the same liquid is used as the alignment liquid and as the carrier liquid. Typically water is preferred as the alignment liquid and as the carrier liquid.

In an embodiment a curable adhesive is deposited as the alignment liquid. In that embodiment the component is adhered to the web by curing said curable adhesive. By way of example, the curable adhesive may be an acrylate having a photo-initiator.

In an embodiment the at least one liquid confinement zone encloses at least one liquid confinement subzone. The alignment liquid is deposited in each of the at least one liquid confinement subzone. The contact between the component and the alignment liquid results in a distribution of the alignment liquid over the liquid confinement zone. Due to the distribution of the alignment liquid from the at least one liquid confinement subzone over the liquid confinement zone, the level of the alignment liquid decreases. In an embodiment of this embodiment an amount of alignment liquid is deposited in the at least one liquid confinement subzone that results in a level Hl of said alignment liquid in the liquid confinement subzone that is higher than a level Hc of an upper surface of the component after it is released and after the alignment liquid is distributed over the liquid confinement zone. This allows for a mode of operation wherein the component to be mounted is moved along a direction parallel to a plane of the web towards the desired location, with its lower surface at a height between the level Hc and the level Hl. In this mode of operation, the component to be mounted can be moved over already mounted components, and subsequently be released by the attractive force of the alignment liquid in the next available location.

The present invention is particularly suitable in a continuous roll to roll process, wherein during an operational state the web is continuously translated along various processing units. However, the present invention is also applicable in stop and go processes. Therein the web is stepwise displaced and one or more operations take place in time intervals between subsequent displacements. Likewise the invention is applicable to batch processes, e.g. wherein the web is processed on a sheet to sheet basis.

In order to adhere the component with the web, an adhesive may be provided on the first side of the web, on a surface of the component facing the web, or on both. For example complementary components of an adhesive may be applied on respective ones of the first side of the web and on said surface of the component. An adhesive or component thereof on the first side of the web preferably is applied with a layer thickness that is smaller than a height of the alignment liquid in the liquid confinement zone. In this way the presence of the adhesive does not impede the alignment of the component with the web.

In an embodiment the inventive apparatus may further comprise a curing unit to cure an adhesive for adhering the component with the web. Alternatively, the component and the web may be adhered by other means, for example by an adhesive that does not need to be cured.

In an embodiment the first side of the web is provided with a functional zone in an area arranged outside the liquid confinement zone. Furthermore, the surface of the component is provided with a complimentary liquid confinement zone and a complimentary functional zone outside said complimentary liquid confinement zone. In an assembled state of the component and the web, the complimentary liquid confinement zone and the complimentary functional zone of the component respectively face the liquid confinement zone and the functional zone of the web respectively. In this embodiment the functional zone of the web and the complimentary functional zone of the component can be kept free from the alignment liquid. This is for example suitable if the water is used as alignment liquid and the component and or the web are provided with electrical conductors.

In an embodiment, for example, the functional zone of the web is provided with first electrically conductive elements, the complimentary functional zone of the component is provided with an electronic module and second electrically conductive elements. In an aligned state of the component after its releasing, the second electrically conductive elements of the component face respective first electrically conductive elements of the web. An electric connection between mutually facing first and second electrically conductive elements may be improved by an isotropic electrically conductive adhesive that is provided on the first and/or the second electrically conductive elements.

Various options are possible to provide for the liquid confinement zone and/or a liquid confinement subzone. For example a liquid confinement zone may be formed by an area having a relatively high surface energy for the alignment liquid used, which area is bounded by an area having a low surface energy for the liquid used. In the same way a liquid confinement subzone can be realized. Also complimentary liquid confinement zones can be formed in that way.

In a preferred embodiment a liquid confinement zone and/or a liquid confinement subzone is delimited by a trench. This does not require modifying a surface energy of the web or the component according to a pattern. A trench to delimitate a zone or subzone may be applied by a radiation beam, for example from a laser. An even better delimitation of the (sub-)zones is obtained when the trench is bounded by a rim. It has been found that when the trench is formed by irradiation of the surface of the web or the component with a laser beam, the height of the rim can be accurately controlled by controlling the fluence of the laser beam. In practice the height of the rim is approximately linearly dependent on the fluence for relatively low values of the fluence.

According to a third aspect of the invention an assembled product is obtained that comprises a first layer and a second layer that are mutually adhered. The first layer has at a first side facing the second layer at least a liquid confinement zone and a liquid confinement subzone enclosed by the liquid confinement zone.

In an embodiment of the product the liquid confinement zone and/or liquid the confinement subzone is delimited by a trench.

In an embodiment of that embodiment the trench is bounded by a rim.

In an embodiment of the product according to the third aspect of the invention the first side of the first layer is further provided with a functional zone in an area arranged outside the liquid confinement zone. The second layer is provided with a complimentary liquid confinement zone and a complimentary functional zone outside the complimentary liquid confinement zone. The complimentary liquid confinement zone and the complimentary functional zone of the component respectively face the liquid confinement zone and the functional zone of the web respectively.

BRIEF DESCRIPTION OF THE DRAWINGS

These and other aspects are described in more detail with reference to the drawing. Therein:

FIG. 1A, 1B show a first embodiment of a method according to the present invention; Therein FIG. 1A shows a top-view, and FIG. 1B shows a side-view according to IB.

FIG. 2 shows a possible tool for use in a method and an apparatus according the present invention, FIG. 2A to 2F shows additional details of an embodiment of this embodiment.

DETAILED DESCRIPTION OF EMBODIMENTS

Figure 2F:
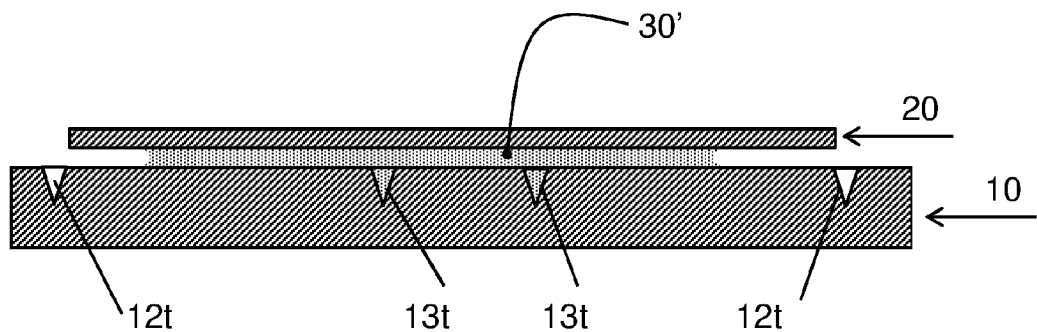

Like reference symbols in the various drawings indicate like elements unless otherwise indicated.

FIG. 1A, 1B shows a method for assembling a component 20 with a web 10. Therein FIG. 1A shows a side-view and FIG. 1B shows a top-view according to IB in FIG. 1A. More detailed information is also provided in FIG. 2A-2F according to side-view II as indicated in FIG. 1B. The method comprising the following steps.

In step S1 a web 10 is provided having a first side 11 with at least one liquid confinement zone 12. In this example the liquid confinement zone encloses at least one liquid confinement subzone 13 having a smaller surface area than the liquid confinement subzone. The at least one liquid confinement subzone may for example have an surface area of about 0.05 to 0.3 times the surface area of the liquid confinement zone 12. In this example each liquid confinement zone includes one liquid confinement subzone. Alternatively, each liquid confinement zone may include more than one liquid confinement subzone. In other embodiments liquid confinement subzones may be absent. The web is for example a polymer foil, e.g. polyethylene naphthalate (PEN), polyethylene terephthalate (PET) or polyimide (PI). Alternatively the web may be formed by another material, e.g. a metal or glass. In this embodiment the web is a PEN-foil and the liquid confinement subzone 13 and the liquid confinement zone 12 are delimitated by a respective trench 13$t$, 12$t$, as indicated by dotted lines.

In step S2 an alignment liquid 30 is deposited in the at least one liquid confinement zone 12. In this case the alignment liquid 30 is deposited in the at least one liquid confinement subzone 13 enclosed by the at least one liquid confinement zone 12.

In step S3 the component 20 is moved towards the liquid confinement zone 12. See also FIG. 2B for additional detail.

In step S4 a surface 21 of the component 20 facing the web 10 is brought into contact with the alignment liquid 30 in the at least one liquid confinement subzone 13. FIG. 2C shows additional detail for this step.

Figure 3:
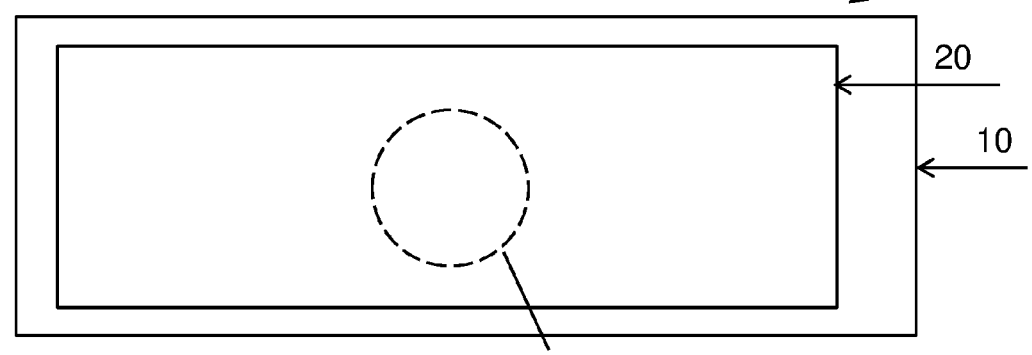
FIG. 3 shows a top-view according to III in FIG. 2F.

In step S5 the component 20 is released. In this embodiment the component 20 is released after step S4, wherein a contact is realized between the surface 21 of the component 20 and the alignment liquid 30. Alternatively it may be considered to release the component 20 before said contact is formed, i.e. by dropping the component upon the alignment liquid. The physical contact obtained in step S4 results in a distribution of the alignment liquid over the liquid confinement zone. Alternatively, if the liquid confinement zone 12 does not include a liquid confinement subzone 13, the alignment liquid may already be distributed in the liquid confinement zone 12. In the illustration of step S5 in FIG. 1A, 1B, and also in more detail in FIG. 2D the partly distributed alignment liquid 30' is shown. Subsequently, in step S6 (see FIG. 2E) the alignment liquid 30" distributed over the liquid confinement zone 12 exerts adhesive forces on the component 20 that align the released component 20 with the web 10. After alignment, the alignment liquid can be removed (for example by evaporation) or cured into a cured substance 32 (as shown in FIG. 2F) and the component 20 can be adhered to the web 10. In an embodiment the alignment liquid is a curable adhesive and the component 20 is adhered to the web 10 by curing the curable adhesive. In this way an assembled product 50 is obtained as shown in cross-section in FIG. 2F. FIG. 3 shows a top-view of the assembled product 50 according to according to III in FIG. 2F.

Figure 2F:
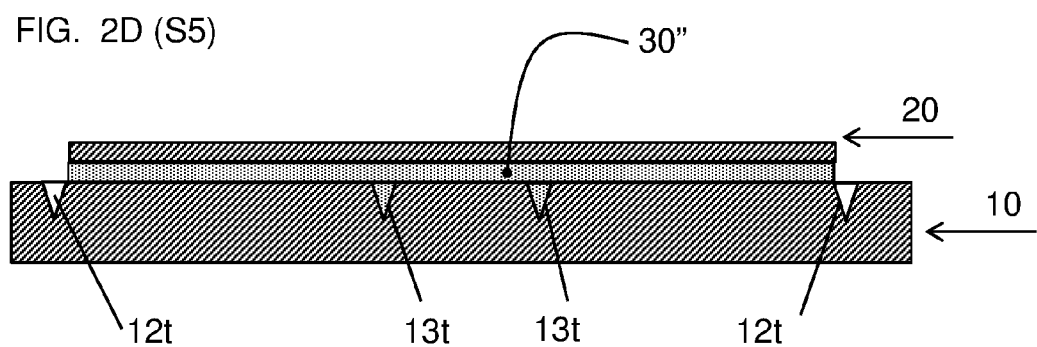
Figure 2F:
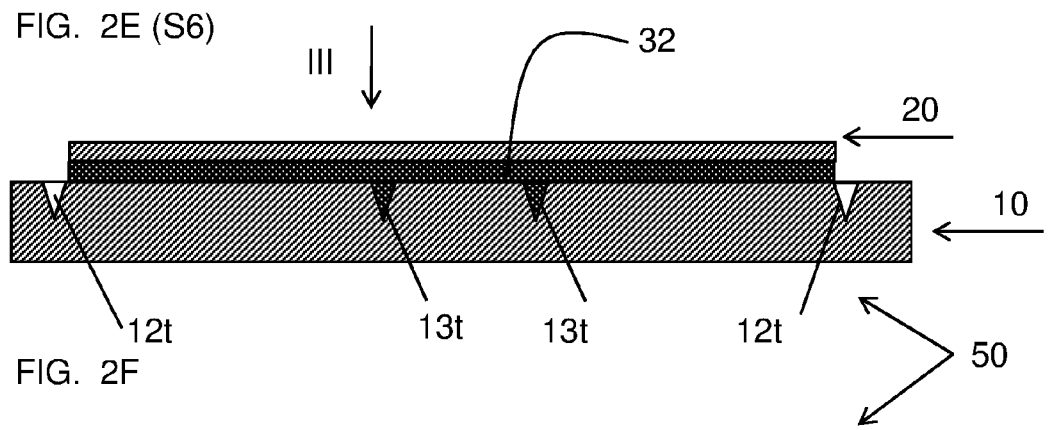

In the embodiment shown in FIG. 1A, 1B, a gripping tool 130 is used that includes one or more capillary tubes 131 (In this case three capillary tubes). As shown in more detail in FIG. 2 the capillary tubes 131 are open at both ends, of which the downward facing opening is specifically indicated with reference number 132. At least a portion of the capillary tubes that ends in the downward facing opening 132 is filled with a carrier liquid 135. The capillary tubes 131 may be at least partially filled by using a liquid pump that provides the capillary tubes 131 with the carrier liquid 135 from the opening opposite the downwards facing opening. Alternatively the capillary tubes 131 may be at least partially filled by dipping the capillary tubes in a container 137 provided with carrier liquid, as illustrated in FIG. 2A. A relatively small immersion depth suffices for this purpose. As shown in FIG. 2B the gripping tool 130 is capable of moving the component 20 towards the web in that an adhesive force Fa1 exerted by the carrier liquid on the component 20 is larger than a second force Fg, that is exerted by gravity on the component 20. The adhesive force Fa1 therein is the sum of the adhesive forces exerted by the carrier liquid present on each of the capillary tubes 131. As shown in FIG. 2C, the first adhesive force Fa1 is smaller than the sum Fg+Fa2 of the second force Fg and a third, adhesive force Fa2 exerted by the alignment liquid 30 on the component 20 when the component comes into contact with the alignment liquid. This has the effect that once the component 20 comes into contact with the alignment liquid 30, a net force Fa1−Fg−Fa2 results that pulls the component from the gripper. In this way it is avoided that a separate control mechanism is necessary to have the gripper release the component.

It the embodiment shown the last stage of the step S3 of moving the component towards the liquid confinement zone 12 comprises moving the component 20 in a downward direction. This is not necessary, provided that an amount of alignment liquid 30 is deposited in the at least one liquid confinement subzone 13 that results in a level Hl of said alignment liquid in the liquid confinement subzone that is higher than a level Hc of the upper surface (23) of the component 20 after it is released and after the alignment liquid is distributed over the liquid confinement zone 12.

Figure 4:
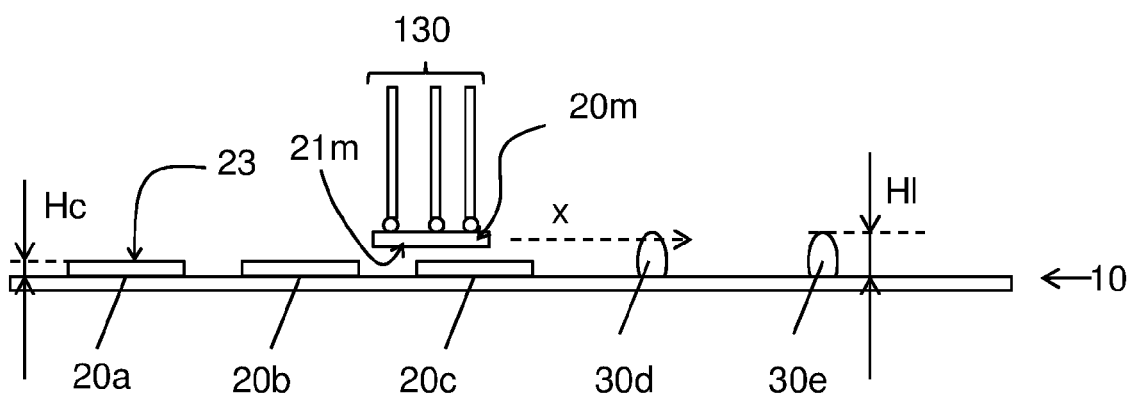
FIG. 4 shows an alternative for a step of the inventive method.

This allows for an alternative mode of operation as shown in FIG. 4. Therein the component 20m to be mounted is moved along a direction x parallel to a plane of the web towards the desired location, with its lower surface 21m at a height between the level Hc and the level Hl. In this example components 20a, 20b, 20c are already mounted and alignment liquid 30d, 30e is deposited in locations that are still available. In this mode of operation, the component 20m to be mounted can be moved over the already mounted components, e.g. 20a, 20b, 20c, and subsequently be released by the attractive force of the alignment liquid 30d in the next available location.

Figure 5A:
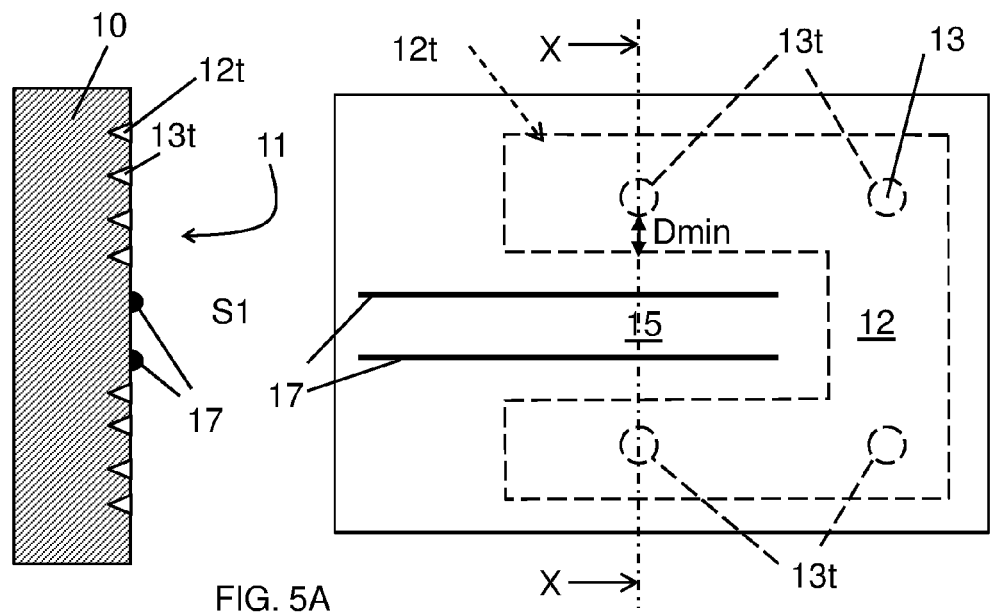
FIG. 5A to 5F show an alternative embodiment of the method according to the present invention.
Figure 5B:
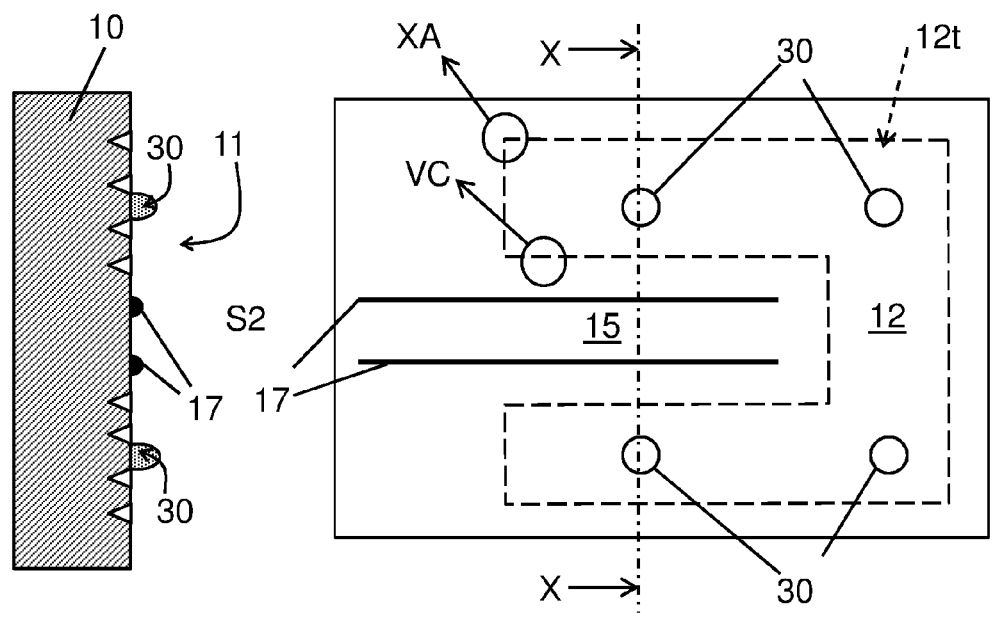
Figure 5C:
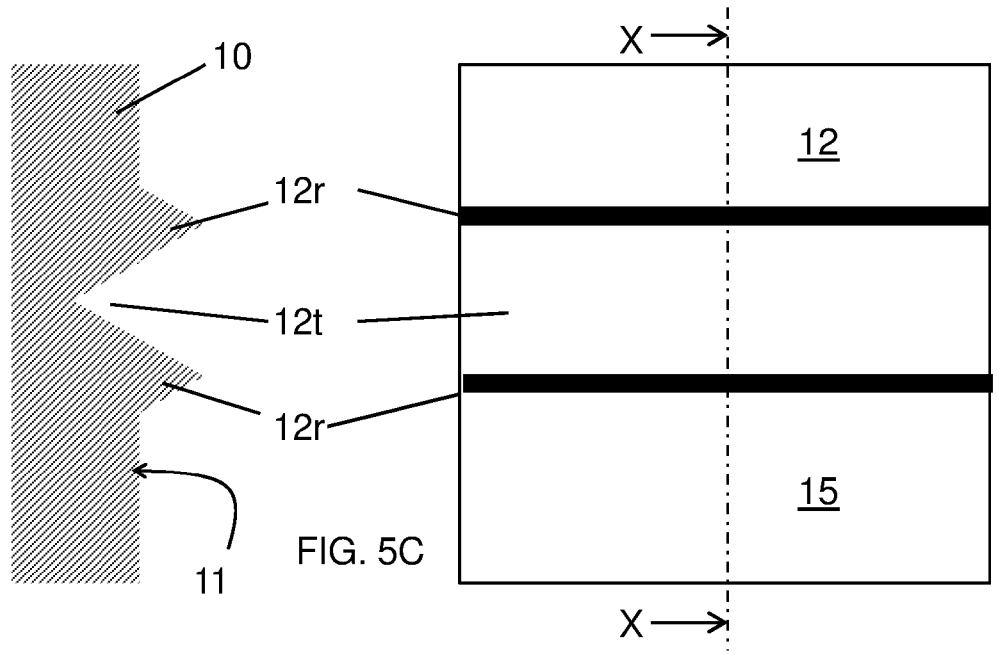
Figure 5D:
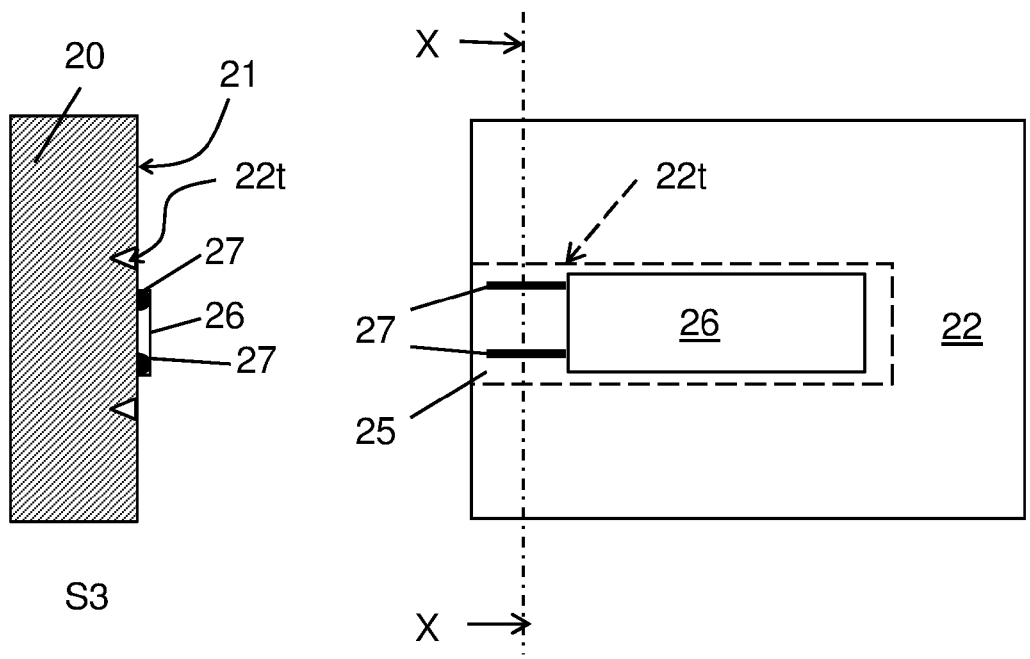
Figure 5E:
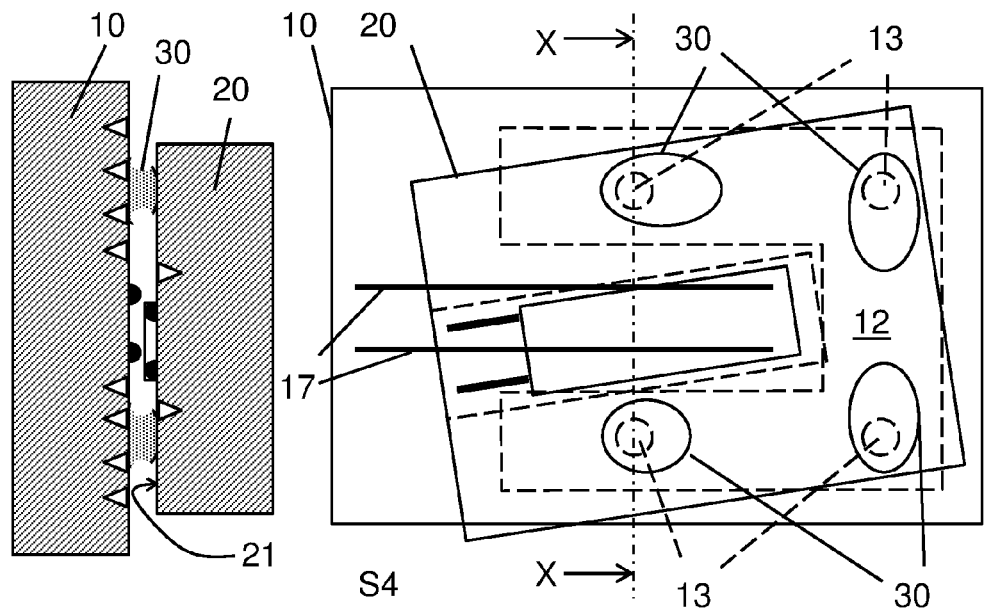
Figure 5F:
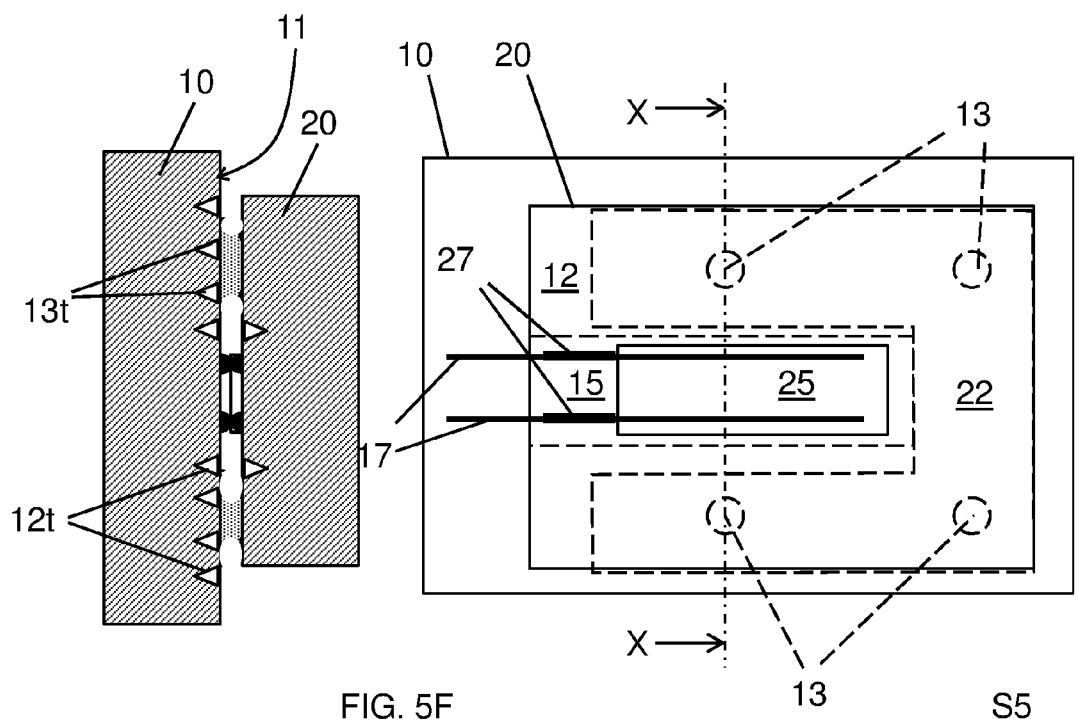
Figure 6:
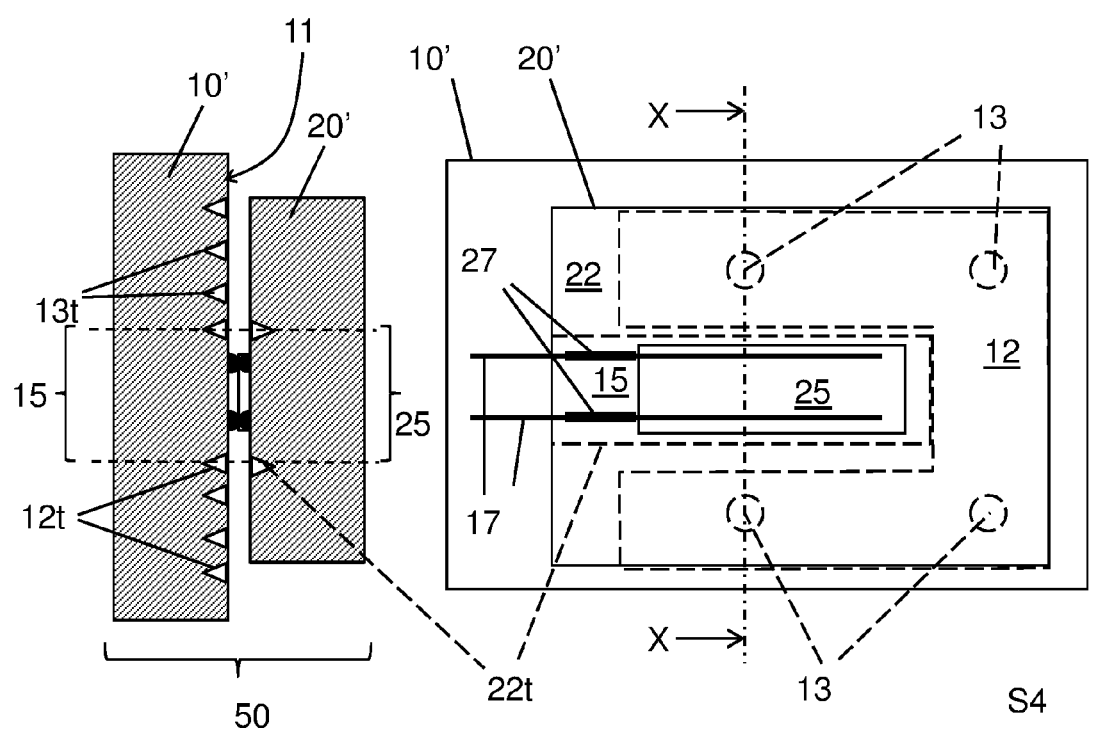
FIG. 6 shows a product obtained with the embodiment of the method according to FIG. 5A-5F.

FIG. 5A to 5F show an alternative method according to the present invention and FIG. 6 shows a resulting assembled product. Each of FIGS. 5A to 5F and 6 comprises a top-view on the right hand side and a corresponding cross-section X-X as indicated therein on the left-hand side. FIG. 5C shows a detail according to VC in FIG. 5B.

As shown in FIG. 5A for example, in this embodiment a first side 11 of the web 10 is provided with a functional zone 15 in an area arranged outside the liquid confinement zone 12. FIG. 5D shows that the surface 21 of the component 20 is provided with a complimentary liquid confinement zone 22 and a complimentary functional zone 25 outside the complimentary liquid confinement zone. As shown in FIG. 6 in an assembled state of the component 20 and the web 10, the complimentary liquid confinement zone 22 of the component faces the liquid confinement zone 12 the web 10. Also complimentary functional zone 25 of the component 20 faces the functional zone 15 of the web 10.

In this embodiment the functional zone 15 of the web 10 is provided with first electrically conductive elements 17, here in the form of electrically conductive lines printed on the surface 11 See FIG. 5A. Also in this embodiment (see e.g. FIG. 5D), the complimentary functional zone 25 of the component 20 is provided with an electronic module 26 and second electrically conductive elements 27, e.g. also in the form of printed electrically conductive lines. In an aligned state (See e.g. FIG. 5F) of the component 20 after its releasing, the second electrically conductive elements 27 of the component face respective first electrically conductive elements 17 of the web.

More in detail FIG. 5B illustrates the result of the step wherein an alignment liquid 30 is deposited in the at least one liquid confinement subzone 13.

FIG. 5C shows a detail according to VC in FIG. 5B of a part of the boundary between the liquid confinement zone 12 and the functional zone 15 of the web 10. As can be clearly seen in FIG. 5C, the liquid confinement zone 12 is delimited by a trench 12t. The liquid confinement zone 12 encloses a liquid confinement subzone 13 that is also delimited by a trench 13t (See for example FIG. 5A). This avoids that the surface 11 of the web needs to be provided with a surface energy pattern. Nevertheless, in alternative embodiments the various zones may be provided alternatively or in addition by a surface energy pattern. For example a liquid confinement zone 12 and the liquid confinement subzones 13 therein may be formed by an area having a relatively high surface energy for the alignment liquid 30 used and the functional zone 15 may be formed by and area having a low surface energy for the alignment liquid 30 used.

FIG. 5C also shows that in this embodiment the trench 12t is bounded by a rim 12r. Likewise the trench 13t may be bounded by a rim.

FIG. 5D shows an example of the component 20 to be assembled with the web 10 in this embodiment. The electronic module 26 may for example be a data-processor, a battery or an electro-optic device, e.g. a display. Although in this case only two electrically conductive elements 27 are shown, the electronic module 26 may have another number of electrically conductive elements, or even have no electrically conductive elements at all. The electronic module 26 may for example operate stand-alone, and be powered by a built-in battery and/or solar cell. The electronic module may communicate wirelessly with other elements in the product or in the environment. FIG. 5D also shows that in this embodiment the complementary liquid confinement zone 22 is delimited from the complimentary functional zone 25 by a trench 22t. The trench 22t may be bounded by a rim in the same way as shown for the trench 12t in FIG. 5C. The complimentary liquid confinement zone 22 is further delimited by an edge of the surface 21 of the component 20.

FIG. 5D shows the result of the step wherein the component 20 is moved towards the liquid confinement zone 12. Therewith a surface 21 of the component facing the web 10 is brought into contact with the alignment liquid 30 in the at least one liquid confinement subzone 13. As can be seen in FIG. 5D, the contact between the surface 21 of the component 20 and the alignment liquid 30 results in a distribution of the alignment liquid 30 over the liquid confinement zone 12. The alignment liquid 30 distributed over the liquid confinement zone 12 exerts adhesive forces on the component 20 that align the released component 20 with the web 10 as can be seen in FIG. 5F.

Referring back to FIG. 2A, it is noted that in the embodiment shown the liquid confinement subzones 13 are at a predetermined minimum distance Dmin from the boundary with the functional zone 15. In this way, it is prevented that the alignment liquid 30 inadvertently contacts the complimentary functional zone 25 of the component even when the component 20 is initially relatively strongly misaligned. The predetermined minimum distance may for example be equal to a diameter of the liquid confinement subzones 13.

FIG. 6 shows an assembled product 50 obtained in this way. The assembled product 50 comprises a first layer 10' and a second mutually adhered layer 20'. The first layer 10' may be the web 10 used in the method described with reference to FIG. 5A to 5F and the second layer 20' may be the component mounted in this method. Alternatively the first layer 10' may be a separated portion of the web 10. As can be seen in FIG. 6, wherein the first layer 10' comprises, at a first side 11 facing the second layer 20' at least a liquid confinement zone 12 and at least a liquid confinement subzone 13 enclosed by the liquid confinement zone 12. In this case four liquid confinement subzones 13 are provided within the liquid confinement zone 12. In particular, the liquid confinement zone 12 is delimited by a trench 12t. Also each of the four liquid confinement subzones 13 is delimited by a trench 13t.

The trench 12t is bounded by a rim 12r as shown in FIG. 5C. Similarly the trench 13t is provided with a rim.

In the embodiment shown in FIG. 6 the first side 11 of the first layer 10' is further provided with a functional zone 15 in an area arranged outside the liquid confinement zone 12. The second layer 20' is provided with a complimentary liquid confinement zone 22 and a complimentary functional zone 25 outside said complimentary liquid confinement zone 22. The complimentary liquid confinement 22 zone of the second layer 20' faces the liquid confinement zone 12 the first layer 10'. Also the complimentary functional zone 25 of the second layer 20' faces the functional zone 15 of the first layer.

The complimentary functional zone 25 and the complimentary liquid confinement zone 22 of the second layer are separated from each other by a trench 22t. The trench 22t is provided with a rim (not shown here but analogous as shown for trench 12t in FIG. 5C).

Figure 7:
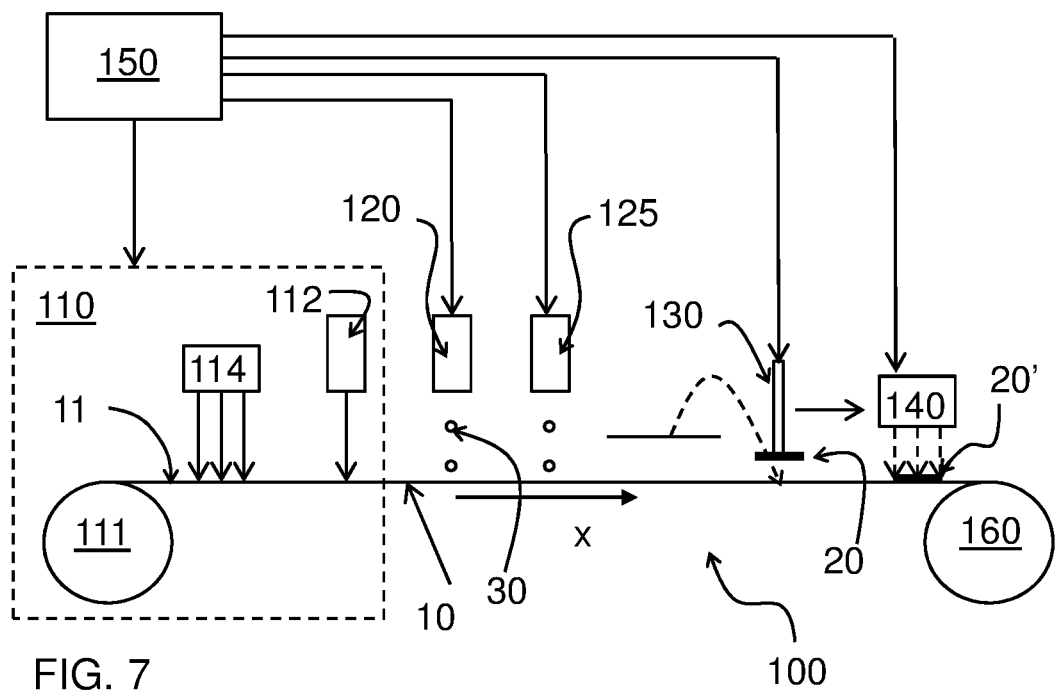
FIG. 7 shows an embodiment of an apparatus according to the present invention.

FIG. 7 schematically shows an apparatus 100 for assembling a component 20 with a web 10. The apparatus comprises a web-delivery unit 110, a deposition unit 120, and a component handling unit 130, and a controller 150. In this case the apparatus operates in a continuous roll to roll mode. I.e. the web is transported at a substantially constant speed in a direction x through the various manufacturing stages. The controller 150 is arranged and programmed to control the web-delivery unit 110 to provide a web 10 having a first side 11 with at least one liquid confinement zone 12 and at least one liquid confinement subzone 13 enclosed by the liquid confinement zone. The web-delivery unit 110 may provide the web from a storage roll 111 that stores the web having the specified zones. Alternatively, as shown in FIG. 7 the web-delivery unit may locally provide the first side 11 of the web with the specified zones. In the embodiment shown this is realized by a laser patterning device 112, controlled by the controller 150, that patterns the first surface of the web into the specified zones by forming trenches in said surface 11 that delimit the zones. In an embodiment the controlled laser patterning device 112 may in this way for example provide the surface 11 with a pattern of trenches 12t, 13t as shown in FIG. 1B or as shown FIG. 5A. In the embodiment shown, the web delivery unit 110 further comprises a printer unit 114 for applying electrically conductive elements (for example elements 17 as shown in FIG. 5A) on the surface 11 of the web.

The controller 150 is further arranged and programmed to control the deposition unit 120 to deposit an alignment liquid 30 in the liquid confinement subzones.

In the embodiment shown, the controller 150 is further arranged and programmed to control a further deposition unit 125 to deposit an adhesive on the first surface 11 of the web, for example in the liquid confinement zones.

Alternatively, or in addition, deposition unit (not shown), controlled by the controller 150 may be present to deposit an isotropic adhesive to support an electric connection between respective contacts of the component 20 and the web. For example an epoxy-based Ag-filled isotropic conductive adhesive (ICA) (CE-3103 WLV, Henkel), for example stencil-printed on the electrically conductive elements.

The controller 150 is further arranged and programmed to control the component handling unit 130 to move the component 20 towards the liquid confinement zone, to subsequently release the component and to bring a surface 21 of the component 20 facing the web into contact with the alignment liquid 30 in the liquid confinement subzone 13. The contact between the component 20 and the alignment liquid 30 results in a distribution of the alignment liquid over the liquid confinement zone. The alignment liquid 30 distributed over the liquid confinement zone exerts adhesive forces on the component that align the released component with the web.

The apparatus 100 shown in FIG. 7 further includes a curing unit 140, controlled by controller 150 that causes the adhesive applied by the further deposition unit(s) 125 to cure the deposited adhesive(s) and/or to evaporate the alignment liquid 30 between the component 20' and the web 10. It is noted that the adhesive does not impede the alignment of the component as long as it is not yet cured. In an embodiment the adhesive is a curable adhesive that serves as the alignment liquid. In another embodiment the deposited adhesive has a maximum height that is lower than a height of the alignment liquid in the liquid deposition subzones, and preferably a height that is lower than a height of the alignment fluid after it is distributed over the liquid deposition zone.

The apparatus 100 further comprises a storage roll 160 for receiving and storing the assembled product comprising the web 10 and the components 20' assembled therewith.

Figure 8A:
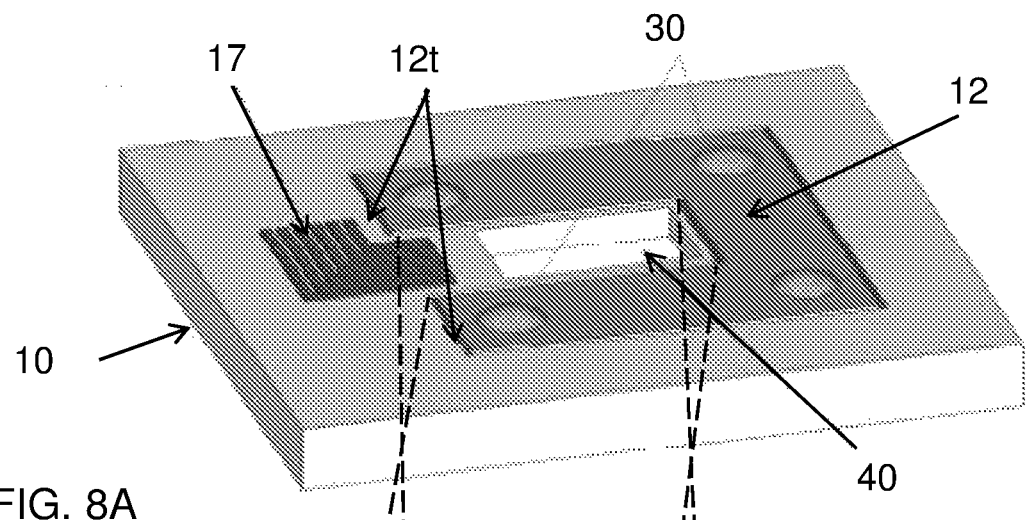
FIG. 8A, 8B shows an example of parts to be assembled according to an embodiment of the method according to the present invention.
Figure 8B:
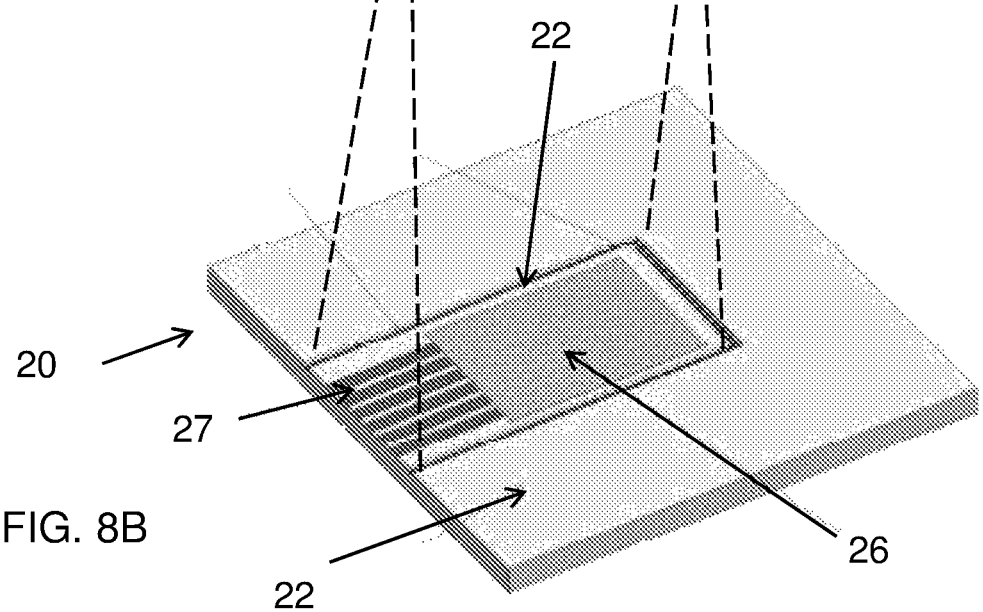

FIGS. 8A and 8B respectively show in a perspective view an example of a prepared portion of a web 10 (FIG. 8A) and a component 20 (FIG. 8B) to be assembled with each other. In the embodiment shown, the component 20 is provided with an electronic module 26, here a printed sensor. Position of the component 20 and the web 10 facing each other after assembly are shown schematically by dashed lines in FIG. 8A, 8B. In particular, the liquid confinement zone 12 of the web 10 faces the complementary liquid confinement zone of the component 20. The electrically conductive lines 17 of the web electrically contact respectively electrically conductive lines 27 of the component 20. The electronic module 26 in this case faces a window 40 provided in the web.

Figure 9A:
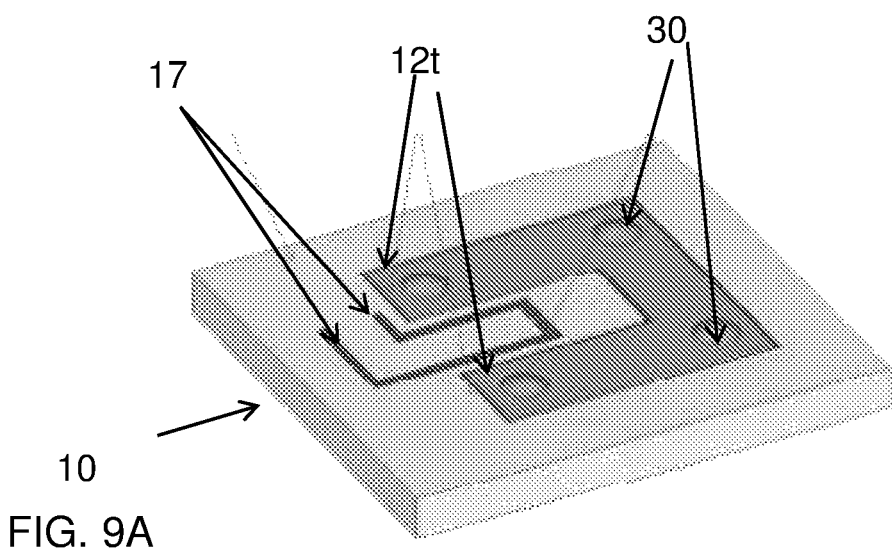
FIG. 9A, 9B show another example of parts to be assembled according to an embodiment of the method according to the present invention.
Figure 9B:
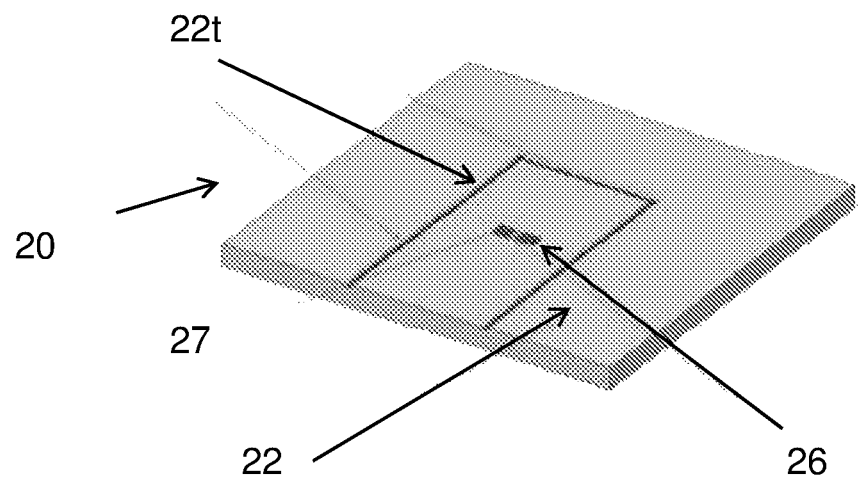

FIGS. 9A and 9B respectively show in a perspective view another example of a prepared portion of a web 10 (FIG. 8A) and a component 20 (FIG. 8B) to be assembled with each other. In the embodiment shown, the component 20 is provided with an RFID sensor as the electronic module 26.

Figures 10A, 10B:
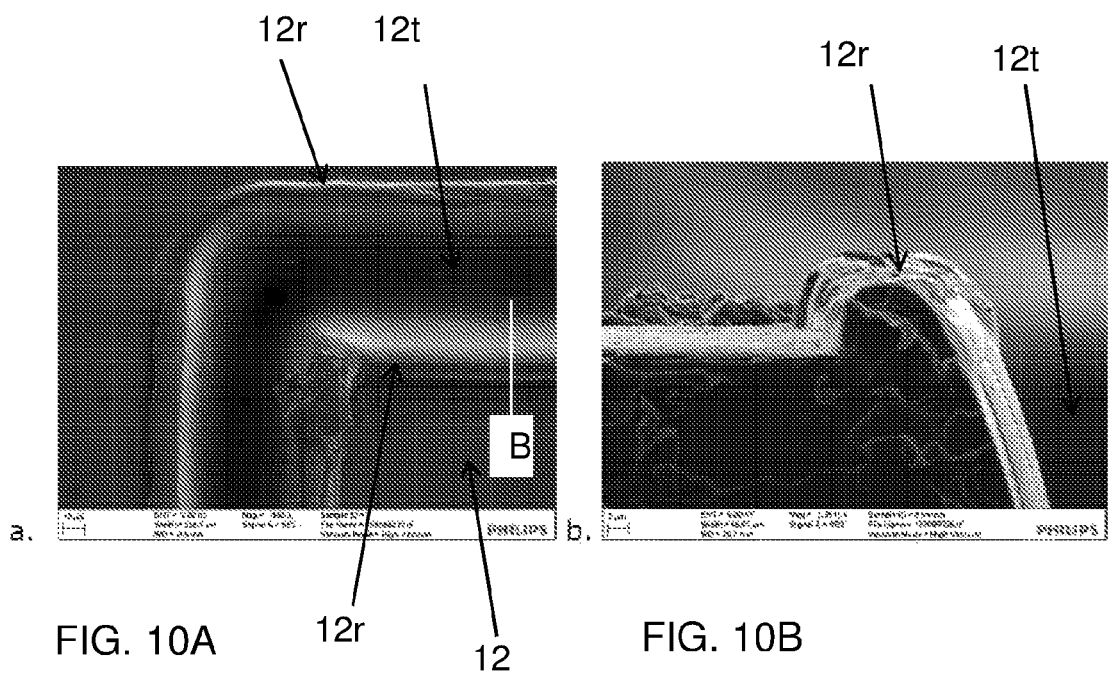
FIG. 10A, 10B show details of a part to be assembled in a product according to the present invention, FIG. 11A-11C provides a first additional illustration of a method according to the present invention FIG. 12A-12C provides a second additional illustration of a method according to the present invention, FIG. 13A-13H provides a third additional illustration of a method according to the present invention.

FIG. 10A shows a SEM image of a part of the trench 12t as indicated by XA in FIG. 5B. The trench 12t having a rim 12r on both sides was applied by irradiation of the surface 11 of the web 10 with a laser beam. FIG. 10B shows a cross-section through a part of the trench 12t and a rim 12r as shown by the white line B in FIG. 10A.

The method according to the present invention was investigated by assembling foil segments of 10×10 mm² as the component onto corresponding regions on a web formed by liquid confinement zones. Both the foil segments and the web were formed from a PEN-sheet (Teonex® Q65FA, DuPont) having a thickness of 125 micron.

The liquid confinement zones in the web were applied by forming trenches in the foil with a nanosecond (Coherent AVIO, 355 nm, 25 ns) Nd:YAG laser source. Also a picosecond (Coherent Talisker, 355 nm, 15 ps) Nd:YAG laser source was used for this purpose. In both cases the spotsize was 45 micron.

It was experimentally found that a depth of the trenches and a height of rim alongside the trenches was substantially linearly dependent for lower settings of the laser fluence. With the nanosecond source the height of the rim varied from 0 to about 9 micron when varying the fluence from about 0.5 to about 4 J/cm². Fluences higher than 4 J/cm² did not result in a substantially higher rim. With the picosecond source the height of the rim varied from 0 to about 6 micron when varying the fluence from about 0.1 to about 2 J/cm². Fluences higher than 2 J/cm2 did not result in a substantially higher rim. The depth of the corresponding trenches was about four times the height of the rim.

The result height of the alignment liquid as a function of the size of the liquid confinement subzone was investigated. To that end 12.5 microliter of water was deposited in circular areas having a diameter in a range between 3.5 to 5 mm. For a diameter less than 3.5 mm the deposited water droplet sometimes tended to spontaneously flow beyond the liquid confinement subzone. For a diameter larger than 5 mm the deposited water droplet did not always completely spread over the liquid confinement subzone. A largest height (of about 2 mm) of the deposited water droplet was obtained in these experiments with a diameter of 4 mm.

An experiment was subsequently carried out with foil segments of 10×10 mm². Web segments were prepared having a liquid confinement zone with dimensions corresponding thereto. Each of the liquid confinement zones had a single, circular, liquid confinement subzone with a diameter of 4.5 mm and centrally arranged therein. A droplet comprising 12.5 microliter of water was deposited in each of these liquid confinement subzones.

Subsequently the foil segments were released with an initial misalignment of approximately 1 mm, i.e. corresponding to 10% of their size. A self-alignment yield of 95% and an alignment accuracy of 15±6 μm was obtained after a series of 20 experiments both for the web segments patterned with the nanosecond laser and patterned with the picosecond laser.

The influence of the wettability of the web segments was investigated. To that end in 25 experiments the influence of an initial misalignment of the component on the resulting alignment was measured for both (1) native web segments from native PEN-foil and (2) web segments from a PEN-foil being subjected to an $O_2$ plasma treatment. Best results were obtained when a native PEN-foil was used for the web segments and a plasma treated PEN-foil for the component. The web segments prepared from the plasma treated foil allowed for an initial misalignment of about 5 mm. Larger initial misalignments appeared to be allowable when using a native PEN-foil.

By way of example FIG. 11A shows an example of a flexible foil 10 having at least one liquid confinement zone 12 and enclosed therein at least one liquid confinement subzone 13. The scale is indicated by the 1 mm mark in the upper right of FIG. 11A. The inset in FIG. 11A shows a cross-section through the foil 10, at the boundary 12b of the liquid confinement zone 12. The scale of this cross-section is indicated by the 10 micron mark in this inset. A similar boundary is provided for the liquid confinement subzone 13 within the liquid confinement zone.

FIG. 11B shows the situation wherein a droplet 30 of alignment liquid (here water) is deposited in the liquid confinement subzone. The droplet has a volume of 12.5 microliter. The inset of FIG. 11B shows lines 16 formed on the foil 10.

In the situation of FIG. 11B a component 20 is brought into contact with the droplet 30. The contact between the component 20 and the alignment liquid 30 resulted in a distribution of the alignment liquid over the liquid confinement zone 12. As can best be seen in the inset of FIG. 11C, the alignment liquid in contact with the component 20 exerted adhesive forces on the component that aligned the released component with the flexible foil 10. In particular it can be seen that marks 28 on the component 20 are accurately aligned with the lines 16.

FIG. 12A again shows an example of a component 20 on a foil 10, which is self aligned by the alignment liquid (water) 30 which was originally deposited in the liquid confinement subzone 13, and which extended over the entire liquid confinement zone 12 subsequent to its contact with the component 20. FIG. 12B shows an enlarged side view of the stack formed by the foil (carrier foil), the alignment liquid 30 (water) and the component (foil die) as seen from the lower right corner indicated by 12B in FIG. 12A. The scale of the photographs of FIG. 12A, 12B is indicated in the upper right corner of these photographs. FIG. 12C more schematically represents this stack, wherein the portion of the schematic at the right hand side of the dashed line in FIG. 12C corresponds to FIG. 12B. FIG. 12C also schematically illustrates the boundary between the interior of the liquid confinement zone 12 and its exterior. In the embodiment shown the boundary 12b comprises a trench having a rim (denoted as microhump in FIG. 12B) on both its sides. FIG. 13A to 13H shows experimental results obtained with a method as schematically illustrated in FIG. 5A to 9B. In this method a foil 12 is provided wherein a functional zone 15 is arranged in an area arranged outside the liquid confinement zone 12. FIG. 13A illustrates how in this case 180 μl of water was distributed with a pipet P over four 6 mm in diameter circular liquid confinement subzones, laser-scribed on the foil 12.

FIG. 13B shows how a 35×30 mm2 functional foil the with Au-sputtered 15×15 mm2 interdigitated capacitive humidity sensor array 20 is brought into contact with the drops 30 of alignment liquid on the foil 10. In this step the component 20 is merely coarsely pre-aligned.

FIG. 13C shows the component 20 onto the foil 10, which further includes printed circuitry. The liquid confinement subzones 13 can still be seen through the material of the component.

FIG. 13D shows in more detail a side view of liquid meniscus 30a sandwiched between self-aligned component 20 in the lower right corner of the corresponding area on the foil 10.

FIG. 13E shows a close-up top view of the interconnect lines 17 forming part of the foil 10 and the corresponding contacts 27 of the component 20. The interconnect lines 17 have a width of 0.7 mm and are mutually spaced with a 0.3 mm wide gap.

In order to determine the quality of the electrical connection formed between the interconnect lines 17 and their associated contacts 27, a comparative capacity measurement was performed. In a first measurement the capacity of the sensors on the component was measured directly, as illustrated in FIG. 13F. In a second measurement the capacity of the sensors on the component was measured using the interconnect lines 17 after component 20 was assembled with the foil 10 using the method illustrated with reference to FIG. 13A to FIG. 13E. The results of these measurement are shown in FIG. 13H.

The left hand side of this FIG. 13H shows a table, wherein the first column identifies the sensor for which the capacity was measured. The second column shows for each sensor the measured capacitance (in pF) as well as the estimated tolerance therein that was obtained with the first measurement. The third column shows for each sensor the measured capacitance (in pF) as well as the estimated tolerance therein that was obtained with the second measurement. The right hand side of FIG. 13H graphically represent the measurement results. As becomes apparent from FIG. 13H, the capacitances as determined in the second measurement do not significantly deviate from the capacitances as determined in the first measurement, indicating that the inventive method results in a reliable electric connection between the contacts 27 of the sensors and their corresponding interconnect lines 17.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Also, use of the "a" or "an" are employed to describe elements and components of the invention. This is done merely for convenience and to give a general sense of the invention. This description should be read to include one or at least one and the singular also includes the plural unless it is obvious that it is meant otherwise.

Unless otherwise defined, all technical and scientific terms used herein have the same meaning as commonly understood by one of ordinary skill in the art to which this invention belongs. Although methods and materials similar or equivalent to those described herein can be used in the practice or testing of the present invention, suitable methods and materials are described below. All publications, patent applications, patents, and other references mentioned herein are incorporated by reference in their entirety. In case of conflict, the present specification, including definitions, will control. In addition, the materials, methods, and examples are illustrative only and not intended to be limiting.

The invention claimed is:

1. A method for assembling a component with a flexible foil, the method comprising the steps of
    providing a flexible foil having a first side with at least one liquid confinement zone, wherein the at least one liquid confinement zone encloses at least one liquid confinement subzone,
    depositing an alignment liquid in the at least one liquid confinement subzone, which alignment liquid when in contact with the component exerts an adhesive force on the component,
    moving the component towards the liquid confinement zone using a gripping tool that includes one or more capillary tubes ending in a downward facing opening, at least a portion of the capillary tubes ending in the downward facing opening being filled with a carrier liquid, wherein a first, adhesive force exerted by the carrier liquid on the component is larger than a second force, that is exerted by gravity on the component, and
    bringing a surface of the component facing the flexible foil into contact with the alignment liquid in the liquid confinement subzone, the alignment liquid therewith exerting a third force on the component, wherein the joint force exerted on the component by the alignment liquid and by gravity exceeds the first, adhesive force exerted by the carrier liquid therewith releasing the component from the gripping tool, wherein said contact between the component and the alignment liquid results in a distribution of the alignment liquid over the liquid confinement zone, and
    wherein the alignment liquid in contact with the component exerts adhesive forces on the component that align the released component with the flexible foil.

2. The method according to claim 1, wherein the at least one liquid confinement subzone has a relatively high surface energy for said alignment liquid as compared to a surface energy of the liquid confinement zone outside said liquid confinement subzone for said alignment liquid, or wherein the liquid confinement subzone and said liquid confinement zone outside said liquid confinement subzone are delimited from each other by a trench, and/or wherein the liquid confinement subzone and said liquid confinement zone outside said liquid confinement subzone are delimited from each other by a rim.

3. The method according to claim 1, wherein, in the step of depositing, a curable adhesive is deposited as the alignment liquid, and wherein component is adhered to the flexible foil in a subsequent step by curing said curable adhesive.

4. The method according to claim 1, further comprising providing said first side of the flexible foil with a functional zone in an area arranged outside the liquid confinement zone, and providing said surface of said component with a complimentary liquid confinement zone and a complimentary functional zone outside said complimentary liquid confinement zone, wherein said component comprises an electronic module in said complimentary functional zone, and wherein in an assembled state of the component and the flexible foil, the complimentary liquid confinement zone and the complimentary functional zone of the component respectively face the liquid confinement zone and the functional zone of the flexible foil respectively.

5. The method according to claim 4, wherein the functional zone of the flexible foil is provided with first electrically conductive elements, and wherein the complimentary functional zone of the component is provided with an electronic module and second electrically conductive elements, wherein in an aligned state of the component after its releasing, second electrically conductive elements of the component face respective first electrically conductive elements of the flexible foil.

6. The method according to claim 1, wherein said liquid confinement zone and/or said liquid confinement subzone is delimited by a trench.

7. The method according to claim 6, wherein the trench is bounded by a rim.

8. The method according to claim 2, wherein an amount of alignment liquid is deposited in the at least one liquid confinement subzone that results in a level of said alignment liquid in the liquid confinement subzone that is higher than a level of an upper surface of the component after it is released and after the alignment liquid is distributed over the liquid confinement zone.

9. An apparatus for assembling a component with a flexible foil, the apparatus comprising at least the following apparatus components, a flexible foil-delivery unit, a deposition unit, and a component handling unit, wherein said component handling unit comprises a gripping tool that includes one or more capillary tubes ending in a downward facing opening and in that the gripping tool in said operational state fills at least a portion of the capillary tubes that ends in the downward facing opening with a carrier liquid, wherein a first, adhesive force exerted by the carrier liquid on the component is larger than a second force, that is exerted by gravity on the component, which apparatus components are arranged and programmed to operate as follows in an operational state of the apparatus, the flexible foil-delivery unit providing a flexible foil having a first side with at least one liquid confinement zone which encloses at least one liquid confinement subzone, the deposition unit depositing an alignment liquid in the liquid confinement subzone, which alignment liquid when in contact with the component exerts an adhesive force on the component, the component handling unit moving the component towards the liquid confinement zone, to bring a surface of the component facing the flexible foil into contact with the alignment liquid in the liquid confinement subzone, the alignment liquid therewith exerting a third, adhesive force on the component, wherein the joint force exerted on the component by the alignment liquid and by gravity exceeds the first, adhesive force exerted by the carrier liquid, therewith releasing the component from the gripping tool, wherein said contact between the component and the alignment liquid results in a distribution of the alignment liquid over the liquid confinement zone, wherein said alignment liquid in contact with the component exerts adhesive forces on the component that align the released component with the flexible foil.

10. An assembled product, comprising a first layer and a second mutually adhered layer, wherein the first laye, at a first side facing the second layer comprises at least a liquid confinement zone that encloses at least one liquid confinement subzone, the at least one liquid confinement subzone having a surface area of about 0.05 to 0.3 times the surface area of the liquid confinement zone.

11. The assembled product according to claim 10, wherein the at least one liquid confinement subzone has a relatively high surface energy for said alignment liquid as compared to a surface energy of the liquid confinement zone outside said liquid confinement subzone for said alignment liquid, or, wherein the liquid confinement subzone and said liquid confinement zone outside said liquid confinement subzone are delimited from each other by a trench, and/or wherein the liquid confinement subzone and said liquid confinement zone outside said liquid confinement subzone are delimited from each other by a rim.

12. The assembled product according to claim 10, wherein said liquid confinement zone and/or said liquid confinement subzone is delimited by a trench.

13. The assembled product according to claim 12, wherein the trench is bounded by a rim.

14. The assembled product according to claim 10, wherein the first side of the first layer is further provided with a functional zone in an area arranged outside the liquid confinement zone, and wherein said second layer is provided with a complimentary liquid confinement zone and a complimentary functional zone outside said complimentary liquid confinement zone, wherein the complimentary liquid confinement zone and the complimentary functional zone of the second layer respectively face the liquid confinement zone and the functional zone of the first layer wherein the functional zone of the flexible foil is provided with first electrically conductive elements, and wherein the complimentary functional zone of the component is provided with an electronic module and second electrically conductive elements, and wherein the second electrically conductive elements of the component face respective first electrically conductive elements of the flexible foil.

* * * * *